United States Patent [19]

Davis

[11] 4,438,331

[45] Mar. 20, 1984

[54] BULK SEMICONDUCTOR SWITCH

[75] Inventor: Steven J. Davis, Hayward, Calif.

[73] Assignee: Power Spectra, Inc., Fremont, Calif.

[21] Appl. No.: 326,683

[22] Filed: Dec. 2, 1981

[51] Int. Cl.³ .............................................. H01J 40/14
[52] U.S. Cl. .................................... 250/211 J; 357/30
[58] Field of Search ......................... 250/211 R, 211 J; 357/29, 30, 22

[56] References Cited

U.S. PATENT DOCUMENTS 4,326,126  4/1982  Auston .............................. 250/211 J
4,326,210  4/1982  Aso et al. ............................... 357/22
4,396,833  8/1983  Pan ........................................ 357/30

Primary Examiner—David C. Nelms
Attorney, Agent, or Firm—John F. Schipper

[57] ABSTRACT

Apparatus for switching kilovoltages in times of the order of one nanosecond or less, using optical radiation with energy input $10^{-7}$ Joules, applied to a cryogenically cooled, suitably doped block of semiconductor material that is positioned across an electrical gap.

7 Claims, 2 Drawing Figures

BULK SEMICONDUCTOR SWITCH

BACKGROUND OF THE INVENTION

The invention is semiconductor switching apparatus for switching kilovoltages over time intervals less than a nanosecond.

D. H. Auston, in "Picosecond optoelectronic switching and gating in silicon", Applied Physics Letters, vol. 26 101 (1975), uses an initial $\lambda=0.53$ $\mu$m pulse to turn conductivity "on" in a thin silicon substrate and a later $\lambda=1.06$ $\mu$m, more deeply penetrating pulse to turn the substrate conductivity "off". Each of the pulses is incident upon a gap in a microstrip transmission line that is laid down upon the top of the silicon substrate and has a modest dc voltage $V=20$ volts between the ends of the line. A second microstrip transmission line is contiguous with the bottom of the silicon substrate. The initial pulse ($\lambda=0.53$ $\mu$m) creates a thin region of high electrical conductivity in the upper portion of the substrate, adjacent to the gap in the top microstrip transmission line, which opens the switch (across the gap) and allows current to flow in the top line, with an estimated response time of perhaps 10-20 psec. The switch is closed by directing the $\lambda=1.06$ $\mu$m radiation at the gap, which creates a deeper region of high electrical conductivity, extending from the top (interrupted) microstrip transmission line through the thin substrate to the grounded bottom line, thus shorting the top transmission line ($\Delta V=0$). Characteristic switching voltages are of the order of 35 volts over 15 psec so that the Auston device acts as a very rapid switch for low voltages or power (35 volts into $\sim$50 ohms). This device requires the use of two laser pulses, one each to switch the device on and off. Auston has obtained U.S. Pat. No. 3,917,943 on this device.

P. Lefur and D. H. Auston, in "A kilovolt picosecond optoelectronic switch and Pockel's cell", Applied Physics Letters, vol. 28 21 (1976), extend the Auston technique to switching kilovolt voltages for fast Pockels cell switching. The dc voltage (20 volts in the earlier approach of Auston) is replaced by a 1.5 kV pulse of 25 nanoseconds (nsec.), to avoid breakdown due to the impressed bias signal before optical switching occurs, and an incident 5 psec. radiation pulse at $\lambda=0.53$ $\mu$m is used to switch the line on across the line gap as before. This paper, concerned as it is with fast, one-way switching of a Pockel's cell ($V=1.5$ kV over 5 psec.), does not discuss "switch off"; but presumably a subsequent radiation pulse at $\lambda=1.06$ $\mu$m would again be used for this purpose. Lefur and Auston estimate that they switched 45 kW of electric power, using approximately 1 mW of optical power (5 joules in 5 psec.), with an associated optical-to-electrical efficiency of 4.5%.

C. H. Lee, in "Picosecond optoelectronic switching in GaAs", Applied Physics Letter, vol. 30 84 (1977), notes that although the Auston et al device provides fast switch-on times, the repetition rate is rather slow ($\sim$1 MHz), due to the slow recombination rates available in a Si substrate. Lee reports on experiments that replace Si by GaAs (with carrier lifetimes $\sim$100 psec.). As Lee notes, the GaAs device only requires an optical pulse for switching on—removal of the pulse will switch the device off automatically. Lee estimates his improved device allows repetition rates in excess of 1 GHz. Lee uses a dc voltage of unknown, but presumably low, magnitude across the gap in the microstrip transmission line. In another experiment, Lee applied dc voltages up to 5 kV across the gap but was unable to switch more than 0.6 kV through the line, Lee notes that the switched voltage amplitude decreases dramatically when applied dc voltage increases above 600 volts or 3.2 kV/cm field strength in bulk, which is the threshold field for onset of differential negative resistance (avalanch) in GaAs. Finally, Lee asserts that use of the 1.5 kV bias pulse (time duration 25 nsec) in place of a dc bias with a GaAs substrate, in analogy with the earlier Lefur and Auston work on switching, may double the output voltage (to 1.2 kV) for the switch.

A. Antonetti et al, in "High Power Switching With Picosecond Precision: Applications to High Speed Kerr and Pockels Cells", Optics Communications, vol. 23 435 (1977), review the abovedescribed work and note that, because intrinsic silicon at room temperature is a poor insulator, use of a dc bias across the gap greater than a few hundred volts is impossible at room temperatures as high voltages will cause switch heating and fusion. Antonetti et al note that one can avoid this dc voltage limitation by (1) cooling the switch to cyrogenic temperatures to increase resistivity (by a factor $\sim 10^4$), conduction band electromobility (by a factor $\sim 10$) and other relevant measures of electrical response or (2) applying voltage pulses of sufficiently short time duration that little heating occurs. Antonetti et al report on an experiment wherein a Si (substrate) switch with the usual microstrip transmission line gap was biased with a 20 nsec. 2.5 kV voltage pulse achieving optical efficiencies (transmission) of about 3% with an associated time delay 50 psec (FIG. 3 of Antonetti et al). Antonetti et al state that $\sim$10 kV voltages can be switched with less than 100 mJoule of radiation at $\lambda=1.06$ $\mu$m, but only if irradiation of the line gap occurs within 2 nsec after initial application of the bias pulse; otherwise, breakdown begins and the shape of the output pulse is not controllable. Antonetti et al further note that use of GaAs rather than Si, or use of an auxiliary gap (with Si) linking the conduction core to the cable ground shield, allows recovery of the non-conducting state automatically, without use of a second light pulse.

Some Russian work on optoelectronic switching is reported by V. M. Volle et al in "High-power nanosecond semiconductor switch" in Soviet Technical Physics Letters, vol. 3 (10) 433 (Oct. 1977) (transl. by American Institute of Physics, 1978). Volle et al report on application of a 20 nsec duration, $\lambda=1.06$ $\mu$m laser pulse to a load resistor, positioned in series with a reverse-biased, voltage blocking semiconductor diode or thyristor in a 1 ohm impedance line, to generate a current pulse that moves away from the resistor along the line at the local speed of light. Upon its arrival, this current pulse apparently switches on the diode or thyristor. The current amplitude for the traveling wave generated in the line increases aproximately linearly with laser radiant energy delivered and then abruptly saturates at a total delivered energy of $\lesssim 10^{-4}$ Joule. Volle et al report voltage switching times of the order of 50 nsec for diode voltage differentials up to the static breakdown limit ($\sim$2.5 kV here).

F. J. Leonberger and P. F. Moulton in "High-speed InP optoelectronic switch", Applied Physics Letters, vol. 35 712 (1979), report the first use of Fe-doped InP in an optoelectronic switch, which switch turns on and off rapidly ($\Delta t \lesssim 50$ psec) in response to irradiation or termination of irradiation of a 3 $\mu$m gap in a microstrip transmission line that is contiguous with and overlies the InP substrate. Use of InP rather than of Si of GaAs is said to allow use of a smaller gap (of width 3 μm, as compared to 2 mm) so that less optical power is required for switching. The laser pulse widths used were 200 psec for λ=1.06 μm and 140 psec for λ=0.53 μm. The applied dc bias voltage was 0.1 volts and average applied laser power (λ=0.53 μm) was 8 milliwatts. In part, the smaller electrical/optical signals necessary to drive the system of Leonberger et al appear to derive from the smaller (by a factor of 10) impedance values of InP vis-a-vis the impedance of Si and GaAs.

U.S. Pat. No. 2,402,662 to R. S. Ohl discloses and claims a photocell comprising a slab of used silicon having a transversely oriented, light sensitive barrier to electron conductivity that is produced by fusing and cooling granulated silicon of purity >99%, the barrier portion of the cell having a polished surface, having electrical terminals connected to opposite sides of the barrier portion, and having a protective, light-transparent layer overlying the barrier portion.

John N. Shive, in U.S. Pat. No. 2,641,713, discloses and claims a photosensitive semiconductor device comprising: a slab of semiconductor material that is divided into three mutually exclusive regions; of p-type, of n-type and with a contiguous intermediate or transition zone separated by a distance that is no greater than the diffusion length of minority carriers in the transition zone; having a bias voltage impressed between the p-type zone and n-type zone; and means for irradiating one face of the device with electromagnetic radiation of optical frequencies.

An alternating current gate circuit is disclosed and claimed by J. N. Shive in U.S. Pat. No. 2,790,088, the circuit comprising: two input terminals; two output terminals; a first shunt connection with impedance between the pair of input terminals; a second shunt connection with impedance between the pair of output terminals; a first electrical connection between an input terminal and an output terminal, including an asymmetric, light-responsive semiconductor (similar to the Shive semiconductor utilized in U.S. Pat. No. 2,641,713 above); a voltage bias between the first input terminal and first output terminal; and means for irradiating ther semiconductor material.

As noted above, U.S. Pat. No. 3,917,943 to P. H. Auston discloses and claims the method and apparatus discussed by Auston in his 1975 paper, discussed above.

James L. Miller teaches and claims apparatus for an optically excited diode current limiter in U.S. Pat. No. 3,986,495. The apparatus includes a pair of opposed silicon diodes, electrically connected to one another and in series with a voltage source, and an enclosure to protect the diodes from exposure to stray light. As light of controllable and increasing intensity is directed at both diodes, diode conductivity increases slowly and allows small, controllable electrical signals below a predetermined level to pass through the diodes.

All these devices appear to require radiative inputs at the gap of at least 100 mJoule and thus require conventional large, high power lasers having high power outputs of $10^7$–$10^8$ watts for assumed pulse lengths of 1–10 nsec.

SUMMARY OF THE INVENTION

The subject invention is a bulk semiconductor switch capable of switching voltages of 5 kV and even higher over times of the order of 500 picoseconds, using various techniques to suppress the appearance of thermally-induced charge carriers that might otherwise respond to impression of a modest dc electric field across a semiconductor block. The invention requires a radiative input of only 10–100 nJoules (power-input of 20–200 watts for an assumed pulse length of 500 psec.) so that a lower power diode laser could be utilized to activate the switch.

In one embodiment, the invention may comprise a block of electrically insulating base material; two substantially collinear microstrips of electrically conducting material (such as copper) of thickness ~1–3 μm, lying on the same surface of the base material and spaced apart by a gap of ~2 mm; a block of solid semiconductor material (such as Si or GaAs) of length $\gtrsim 6$ mm, lightly doped with boron and positioned to lie on top of a portion of each at the microstrips and across the microstrip gap so as to electrically connect the microstrips; a voltage source electrically connected to the two microstrips to impress a dc voltage $\gtrsim 5$ KV across the microstrip gap; cryogenic cooling units adjacent to the semiconductor block to cool the block to a temperature $T \leq 230°$ K.; and a pulsed radiation source capable of producing a radiative output of 10–100 nJoules to the semiconductor block.

DETAILED DESCRIPTION

Figure 1:
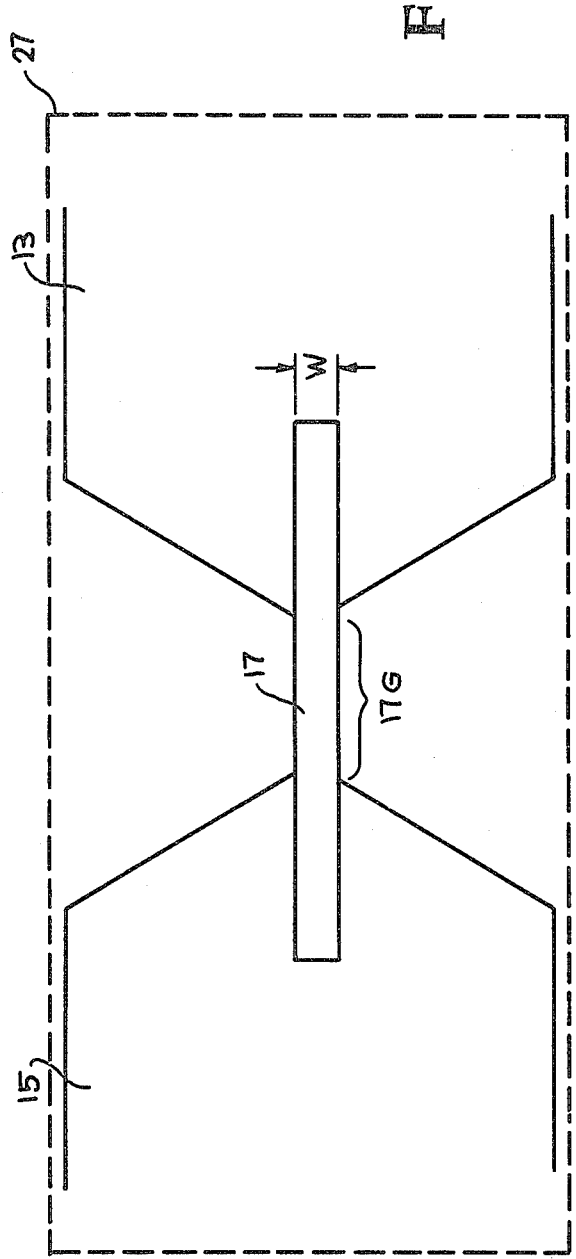
FIG. 1 is a schematic top view of the preferred embodiment of the invention.
Figure 2:
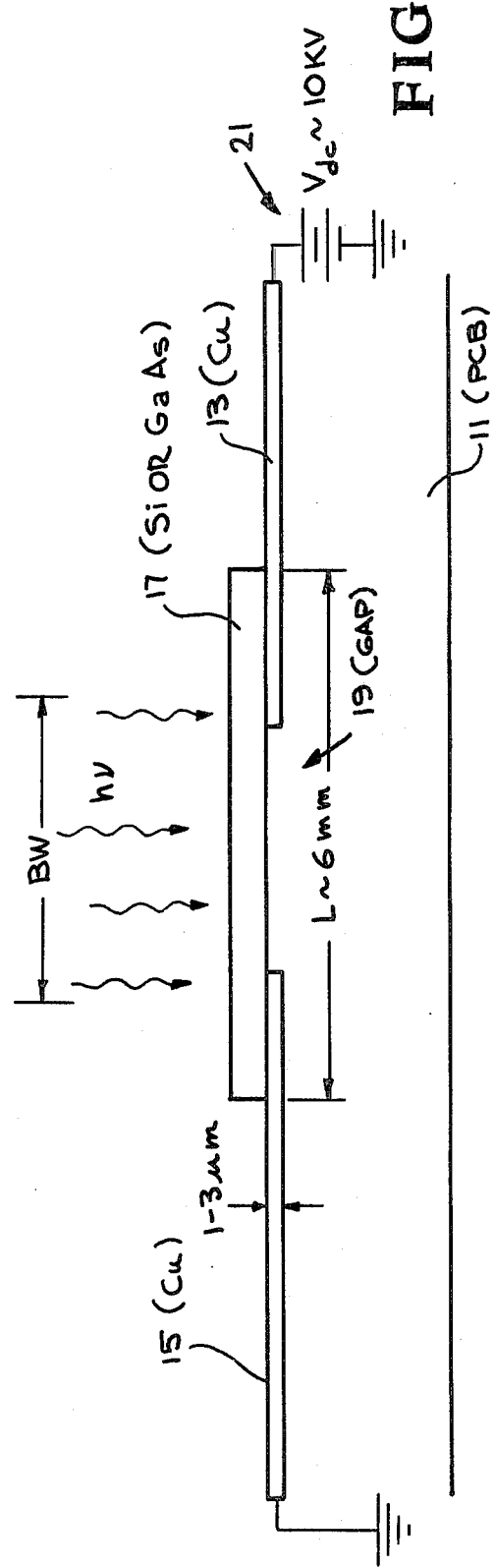
FIG. 2 is a front view of the preferred embodiment, showing the radiation pulse incident upon the semiconductor block.

The invention is a bulk semiconductor switch capable of switching 5 KV and higher voltages over times of the order of 500 picoseconds, using light doping, and crygenic cooling of the semiconductor material to reduce or eliminate thermally-induced charge carriers and using low power laser diodes for rapid switching. FIGS. 1 and 2 exhibit the top and front views of the preferred embodiment, which may include: an insulating base 11, such as a printed circuit board of epoxy, glass or other suitable material, two microstrips 13 and 15 of electrically conducting material such as copper, silver, gold or aluminum of thickness 1–3 μm, a collinearly positioned on the insulating base and spaced apart by a microstrip gsp of length L ~1–3 mm; a substantially rectangular block 17 of semiconductor material such as Si or GaAs of length at least twice the microstrip gap length ($\gtrsim 6$ mm) and being in electrical contact with both microstrips and lying over a microstrip gap 19 as shown; a voltage source 21 electrically connected to the two microstrips to impress a dc voltage $V_{dc} \gtrsim 5$ KV between the microstrips; cryogenic cooling means 23 adjacent to and surrounding the microstrips to impress a temperature of $T \leq 230°$ K. on the microstrips to suppress thermally-induced charge carriers therein; and a pulsed radiation beam source, such as a diode laser 25, with a beam width BW that illuminates all of the portion of the semiconductor block that lies in or over the gap 19 separating the microstrips 13 and 15. Optionally, the insulating block 11, microstrips 13 and 15, and semiconductor block 17 may be surrounded by an epoxy block or housing 27 that suppresses or passivates the surface electrical activity of the microstrips and is transparent to the radiation frequency of the pulsed source 25.

If GaAs is used as the semiconductor material, rapid recombination of the charge carriers ($\tau_{recomb.} \lesssim 10^{-10}$ sec.) in the material will turn the device off electrically with removal of the radiation pulse. The semiconductor block 17 is doped with boron at a concentration of $10^{15}$–$10^{18}$/cm$^3$ to further suppress or eliminate the thermally-induced charge carriers therein. The energy threshold for electrical activation of the device will, of course rise with increasing boron doping concentration as the boron also suppresses the action of radiation-induced charge carriers; preferably, one would use boron doping concentrations of $10^{16}$–$10^{17}$/cm$^3$, for which the radiation energy threshold for semiconductor activation is less than or of the order of 10–100 nanojoules.

With the semiconductor block 17 thus doped and with the block temperature lowered to $T \leq 230°$ K., the thermally-induced charge carriers in the block are suppressed or eliminated, and a dc electric field $V_{dc} \sim 5$–$10$ KV can be impressed across the portion 17G of the block lying over the gap 19 without inducing electrical breakdown within that portion of the block. A diode laser or other low power pulsed radiation source 25 having an associated radiation wavelength $\lambda \sim 1$ $\mu$m($\nu \sim 3 \times 10^{14}$ Hz) is now pulsed and irradiates a portion of the block 17 including the gap portion 17G and electrically activates the gap portion by instantly producing a plasma of minority and majority charge carriers at the surface that quickly establish a surface current flow from, say, microstrip 15 to microstrip 13 under the influence of the impressed dc voltage. The apparatus acts as a switch that turns on in less than 500 picoseconds, with associated jitter controlled by the jitter of the diode laser $\Delta t_{DL} \lesssim 20$ psec. The pulsed radiation is substantially totally absorbed at or near the surface if the associated radiation has wavelength $\lambda \gtrsim 0.8$ $\mu$m($\nu = 2.83 \times 10^{14}$ Hz) as the associated radiation absorption coefficient is $\alpha \sim 10^4$ cm$^{-1}$. The initiating radiation signal required is small enough that a diode laser can be used to switch 2 MV power (10 KV into 50$\Omega$) or more with a sub-nanosecond switching time. The apparatus is scalable to higher current (here $\sim 200$ amps) by increasing the width W of the block 17 and microstrips 13 and 15 and by using illumination of the region 17G by multiple, overlapping radiation sources. The apparatus is scalable to higher voltages by increasing the gap length L and the corresponding length of the semiconductor block.

Although the preferred embodiment of the invention has been shown and described herein, variation and modification may be made without departing from the scope of the invention.

I claim:

1. Apparatus for switching kilovolt magnitude voltages in times of the order of one nanosecond or less, the apparatus comprising:

a block of electrical insulating material;

two microstrips of electrically conducting material of thickness 1–3 $\mu$m, collinearly positioned and spaced apart from one another by a gap of 1–3 mm, both microstrips being mounted on one side of the insulating material block;

a substantially rectangular block of solid semiconductor material having a length of at least twice the length of the microstrip gap and being doped with boron at a concentration of between $10^{15}$/cm$^3$ and $10^{18}$/cm$^3$, with the semiconductor block being maintained in electrical contact with the two microstrips and lying across the microstrip gap;

a voltage source electrically connected to the two microstrips to impress a substantially constant voltage of at least 5 KV between the microstrips;

cryogenic cooling means adjacent to the semiconductor block for cooling the block to a temperature $T \leq 230°$ K.; and a source of pulsed radiation producing a radiative beam output of 10–100 nanojoules, the radiation beam being directed at the microstrip gap and the semiconductor block lying between the microstrip gap and the pulsed radiation source.

2. Apparatus according to claim 1, wherein said insulating block is a printed circuit board.

3. Apparatus according to claim 1, wherein said microstrip electrically conducting material is drawn from a class consisting of copper, silver, gold and aluminum.

4. Apparatus according to claim 1, wherein said semiconductor material is drawn from a class consisting of Si and GaAs.

5. Apparatus according to claim 1, wherein said semiconductor block is doped with boron of concentration $10^{16}$–$10^{17}$/cm$^3$.

6. Apparatus according to claim 1, wherein said voltage source has a potential of substantially 10 KV.

7. Apparatus according to claim 1, wherein said pulsed radiation source is a diode laser having an associated output wavelength $\lambda \geq 0.8$ $\mu$m.

* * * * *